(12) United States Patent
Lundberg

(10) Patent No.: US 7,173,456 B2
(45) Date of Patent: Feb. 6, 2007

(54) DYNAMIC LOGIC RETURN-TO-ZERO LATCHING MECHANISM

(75) Inventor: James R. Lundberg, Austin, TX (US)

(73) Assignee: IP-First, LLC, Fremont, CA (US)

( * ) Notice: Subject to any disclaimer, the term of this patent is extended or adjusted under 35 U.S.C. 154(b) by 569 days.

(21) Appl. No.: 10/730,168

(22) Filed: Dec. 6, 2003

(65) Prior Publication Data

US 2005/0055538 A1     Mar. 10, 2005

Related U.S. Application Data

(60) Provisional application No. 60/432,693, filed on Dec. 10, 2002.

(51) Int. Cl.
*H03K 19/096* (2006.01)
*H03K 3/286* (2006.01)

(52) U.S. Cl. ............................ 326/97; 326/95; 327/201
(58) Field of Classification Search ................. 326/93, 326/95–98; 327/201, 211
See application file for complete search history.

(56) References Cited

U.S. PATENT DOCUMENTS

| 5,075,386 | A | | 12/1991 | Vanderbilt |
| 5,796,282 | A | | 8/1998 | Sprague et al. |
| 5,828,234 | A | | 10/1998 | Sprague |
| 5,889,979 | A | | 3/1999 | Miller, Jr. et al. |
| 6,111,444 | A | * | 8/2000 | Mikan et al. ............... 327/211 |
| 6,133,759 | A | | 10/2000 | Beck et al. |

(Continued)

FOREIGN PATENT DOCUMENTS

EP     0921639 A1     6/1999

(Continued)

OTHER PUBLICATIONS

Partovi H et al: "Flow-through latch and edge-triggered flip-flop hybrid elements" Solid-State Circuits Conference, 1996. Digest of Technical Papers. 42nd ISSCC., 1996 IEEE International San Francisco, CA, USA Feb. 8-10, 1996, New York, NY, USA, IEEE, US, Feb. 8, 1996, pp. 138-139, XP010156427 ISBN: 0-7803-3136-2 *figure 8*.

(Continued)

*Primary Examiner*—James H. Cho
(74) *Attorney, Agent, or Firm*—Gary R. Stanford; Richard K. Huffman; James W. Huffman

(57) ABSTRACT

A dynamic logic return-to-zero (RTZ) latching mechanism including a complementary pair of evaluation devices responsive to a clock signal, a dynamic evaluator, delayed inversion logic, and latching logic. The dynamic evaluator is coupled between the complementary pair of evaluation devices at a pre-charged node and evaluates a logic function based on at least one input data signal. The latching logic asserts the logic state of an output node based on the state of the pre-charged node during an evaluation period between an operative edge of the clock signal and the next edge of an evaluation complete signal, which is a delayed and inverted version of the clock signal. The output node is returned to zero between evaluation periods. A footless latching domino circuit may be added to convert the RTZ output to a registered output signal.

19 Claims, 8 Drawing Sheets

U.S. PATENT DOCUMENTS

| | | |
|---|---|---|
| 6,181,180 B1 * | 1/2001 | Chen et al. .................. 327/211 |
| 6,201,415 B1 | 3/2001 | Manglore |
| 6,265,897 B1 | 7/2001 | Poirier et al. |
| 6,498,514 B2 | 12/2002 | Alvandpour |
| 6,549,038 B1 | 4/2003 | Sechen et al. |
| 6,686,775 B2 | 2/2004 | Campbell |
| 6,791,365 B2 | 9/2004 | Bosshart |
| 2002/0158670 A1 | 10/2002 | Alvandpour |
| 2003/0042932 A1 | 3/2003 | Bales |
| 2003/0052714 A1 | 3/2003 | Alvandpour |
| 2003/0062925 A1 | 4/2003 | Nedovic et al. |
| 2003/0110404 A1 | 6/2003 | Seningen et al. |
| 2005/0046446 A1 | 3/2005 | Qureshi et al. |

FOREIGN PATENT DOCUMENTS

| | | |
|---|---|---|
| WO | WO 99/14881 | 3/1999 |
| WO | WO 02/01328 | 1/2002 |

OTHER PUBLICATIONS

Partovi H et al: "Flow-through latch and edge-triggered flip-flop hybrid elements" Solid-State Circuits Conference, 1996. Digest of Technical Papers. 42nd ISSCC., 1996 IEEE Internatioanl San Francisco, CA, USA Feb. 8-10, 1996, New York, NY, USA, IEEE, US, Feb. 8, 1996, pp. 138-139, XP010156427 ISBN: 0-7803-3136-2 *figure 8*.

* cited by examiner

DYNAMIC LOGIC RETURN-TO-ZERO LATCHING MECHANISM

CROSS-REFERENCE TO RELATED APPLICATIONS

This application claims the benefit of U.S. Provisional Application No. 60/432,693, filed on Dec. 10, 2002, which is herein incorporated by reference for all intents and purposes.

This application is related to U.S. patent application Ser. No. 10/730,703, filed on Dec. 9, 2003, now U.S. Pat. No. 6,965,254. The aforementioned application is commonly owned and has at least, one common inventor, and is herein incorporated by reference in its entirety for all intents and purposes:

BACKGROUND OF THE INVENTION

1. Field of the Invention

The present invention relates to latch circuits, and more particularly to a dynamic logic return-to-zero (RTZ) latching mechanism for logic evaluation functions, where the latching mechanism exhibits a significantly reduced data-to-output time.

2. Description of the Related Art

The complexity of pipelined architectures has grown along with the complexity of logical evaluations required within the individual stages of such architectures. And, since speed is a critical factor in pipelined architectures, more and more work is required to be performed within each stage in less and less time. Numerous techniques have been developed to allow this work to be done within the allotted time. In exemplary techniques, the work is divided between stages and inputs are provided with reduced setup time requirements in subsequent stages so that logic in a preceding stage is provided with the time to complete its logical evaluation. Such techniques, however, only compensate in multiple/subsequent stages for the amount of time that is required to perform a given logical evaluation. In other words, they only treat the symptoms resulting from present day logic techniques that are employed within pipelined systems to perform complex evaluations. The real problem is that present day logic evaluation circuits (e.g., multiplexers, encoders, decoders, bit comparators, etc.) take too long to generate their outputs.

Logical evaluation circuits have associated setup time and hold time requirements for their input data, and they additionally have corresponding clock-to-output time characteristics. The "speed" of a given logic circuit is typically judged in terms of its data-to-output time, that is, the sum of its setup time and clock-to-output time. In a pipelined system, the cumulative effect of slow logic evaluation functions in each stage of the pipeline is a system that exhibits a significantly slower operating speed than would otherwise be desirable.

SUMMARY OF THE INVENTION

A dynamic logic return-to-zero (RTZ) latching mechanism according to an embodiment of the present invention includes a complementary pair of evaluation devices responsive to a clock signal, a dynamic evaluator, delayed inversion logic, and latching logic. The dynamic evaluator is coupled between the complementary pair of evaluation devices at a pre-charged node and evaluates a logic function based on at least one input data signal. The delayed inversion logic receives the clock signal and outputs an evaluation complete signal which is a delayed and inverted version of the clock signal. The latching logic asserts the logic state of an output node based on the state of the pre-charged node during an evaluation period between an operative edge of the clock signal and the next edge of the evaluation complete signal, and returns the output node to zero between evaluation periods. The latching logic includes an N-channel pass device having a gate receiving said evaluation complete signal and a drain and source coupled between said pre-charged node and a pull-up control node; a first P-channel pull-up device having a gate receiving said evaluation complete signal and a drain and source coupled between a source voltage and said pull-up control node; a second P-channel pull-up device having a gate coupled to said pull-up control node and a drain and source coupled between said source voltage and said output node; and an N-channel pull-down device having a gate coupled to said pull-up control node and a drain and source coupled between said output node and ground.

The dynamic evaluator may range from a simple device to a complex logic circuit. The delayed inversion logic may be implemented in any suitable manner. In one exemplary embodiment the delayed inversion logic is implemented as a series chain of inverters. The dynamic logic RTZ latching mechanism may include added logic and added complementary logic that collectively operates to prevent a selected state of the output node. A footless latching domino circuit or the like may be added to convert the RTZ output to a registered output signal.

A dynamic latch circuit according to an embodiment of the present invention includes a dynamic circuit, a delayed inverter, and a latching circuit. The dynamic circuit pre-charges at least one pre-charged node while the clock signal is low and evaluates a logic function for controlling the state of the pre-charged node when the clock signal goes high. The delayed inverter receives the clock signal and provides an inverted delayed clock signal. The latching circuit controls the state of an output node based on the state of the pre-charged node(s) during each evaluation period beginning when the clock signal goes high and ending when the inverted delayed clock signal next goes low. Otherwise, the latching circuit asserts the output node to a zero logic state. Again, a footless latching domino circuit or the like may be added to convert the RTZ output to a registered output signal. The latching circuit includes a pass device that couples a second node to said at least one pre-charged node when said inverted delayed clock signal is high; a first pull-up device that pulls said second node high while said inverted delayed clock signal is low; a second pull-up device that pulls said output node high when said second node is low; and a pull-down device that pulls said output node low when said second node is high.

The dynamic circuit may be implemented as multiple dynamic circuits, each receiving a corresponding input signal and each pre-charging a corresponding pre-charged node. The latching circuit may be implemented as multiple latching circuits, each coupled to a corresponding dynamic circuit, each receiving a corresponding input signal, and each having an output that is wire-ORed coupled to the output node. The use of multiple dynamic and corresponding latching circuits enables implementation of many different logic functions that may vary from very simple to very complex. In one exemplary embodiment, an exclusive-OR logic function is implemented.

A dynamic logic RTZ latching method according to an embodiment of the present invention includes pre-setting a first node while a clock signal is in a first logic state, dynamically evaluating a logic function to control the logic state of the first node when the clock signal transitions to a second logic state, delaying and inverting the clock signal and providing a delayed inverted clock signal, latching a logic state of an output node based on the logic state of the first node determined during an evaluation period beginning when the clock signal transitions to the second logic state and ending with the next corresponding transition of the delayed inverted clock signal, and returning the logic state of the output node to a low logic state between evaluation periods.

The method may include adding a latching domino circuit to the output node to provide a registered output signal. The method may include passing a logic state of the first node to a pull-up control node while the delayed inverted clock signal is in a high logic state, pulling the output node to a high logic state if the pull-up control node is in a low logic state, and pulling the output node to a low logic state if the first node is in a high logic state. The method may include keeping the pull-up control node at a high logic state while the delayed inverted clock signal is at a low logic state and also while the clock signal is at a low logic state.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The inventor of the present application has recognized the need for providing latched outputs for logic circuits in which speed is a critical factor. He has therefore developed an integral return-to-zero (RTZ) latching mechanism for use within complex logic evaluation circuits that employ dynamic circuit principles to enhance the speed by which an evaluant is determined, as will be further described below with respect to FIGS. 1–6. When employed in a pipelined architecture that relies heavily on latching mechanisms to transfer data from stage to stage, dynamic logic RTZ latching mechanisms according to embodiments of the present invention enable overall device operating speed to be significantly increased.

Figure 1A:
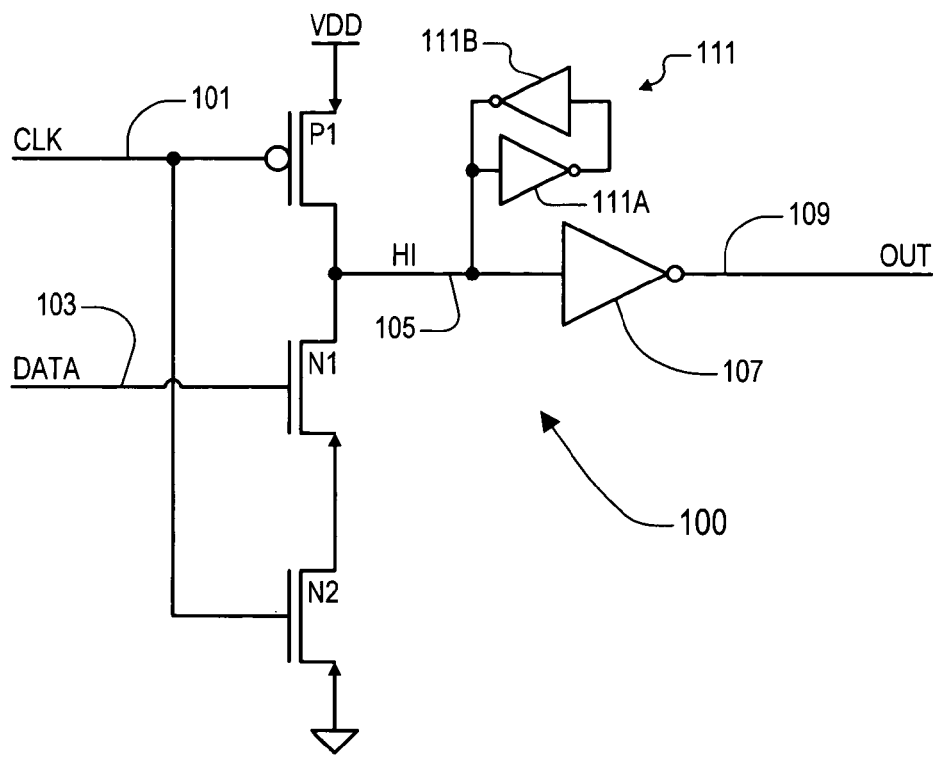
FIG. 1A is a schematic diagram of an exemplary dynamic circuit for illustrating dynamic circuit characteristics.

FIG. 1A is a schematic diagram of an exemplary dynamic circuit 100 for illustrating dynamic circuit characteristics. The dynamic circuit 100 includes an input portion consisting of stacked P-channel and N-channel devices P1, N1 and N2. P1 and N2 are a complementary pair of evaluation devices and N1 is evaluation logic. The source of P1 is coupled to a voltage source VDD and its drain is coupled to a node 105 providing a signal HI. The drain of N1 is coupled to the node 105 and its source is coupled to the drain of N2. The source of N2 is coupled to ground. An input clock signal CLK is provided via a node 101 to the gates of P1 and N2. An input data signal DATA is provided via a node 103 to the gate of N1. The node 105 is coupled to the input of an inverter/buffer 107 having an output coupled to a node 109 providing an output signal OUT. A weak keeper circuit 111 is coupled to the node 105. The keeper circuit 111 includes a first inverter 111A having its input coupled to node 105 for receiving the HI signal and its output coupled to the input of a second inverter 111B, which has its output coupled to node 105.

Figure 1B:
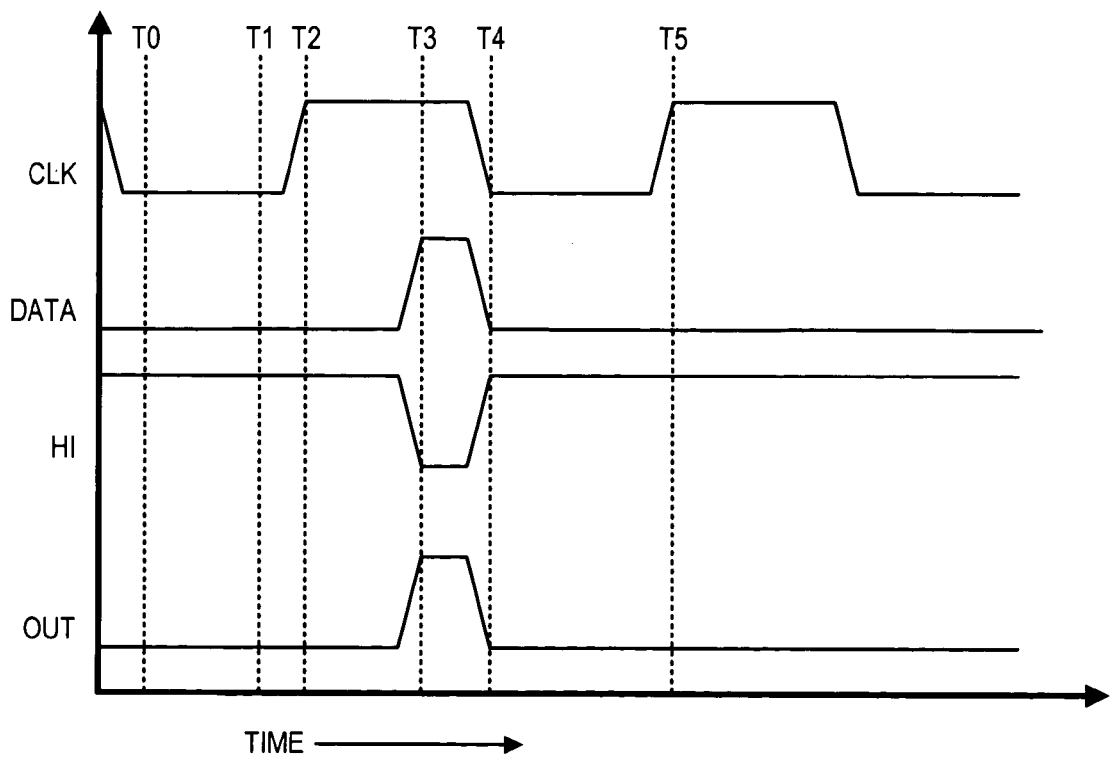
FIG. 1B is a timing diagram illustrating operation of the dynamic circuit of FIG. 1A.

FIG. 1B is a timing diagram illustrating operation of the dynamic circuit 100, in which the CLK, DATA, HI, and OUT signals are plotted versus time. At a time T0 when the CLK signal is low, N2 is turned off and P1 is turned on, which pre-charges the HI signal to a logic high level in preparation for evaluation of the DATA signal upon the rising edge of CLK. During the half cycle when the CLK signal is low, the OUT signal is also asserted low by the inverter 107. Signal DATA is typically low as well during the half cycle when clock is low, as is shown at time T1, because dynamic circuits 100 such as that shown in FIG. 1A are typically configured in a cascaded arrangement with a preceding circuit's OUT signal connected to a subsequent circuit's DATA signal. Hence at time T1, because the DATA signal is at a logic low level, N1 is turned off.

At subsequent time T2, the CLK signal is asserted high which turns N2 on and P1 off. Since the DATA signal is low at time T2, N1 is off so that the HI signal is not driven by the input portion. During this time, however, the keeper circuit 111 maintains the high logic level of the HI signal and the inverter 107 maintains the OUT signal low. If the DATA signal is driven to a high logic level during the half cycle while the CLK signal is high, as shown at subsequent time T3, N1 turns on while N2 is on, which overpowers the keeper circuit 111 so that the HI signal is discharged to a low logic level. The inverter 107 responds by driving the OUT signal high.

The CLK signal subsequently goes low and the DATA signal is also driven low at time T4. The HI signal is pre-charged high once again by P1, and the OUT signal is pulled low. At subsequent time T5, the CLK signal is once again asserted high while DATA is low, so that N2 is turned on, yet N1 is turned off. The HI signal, thus, is not discharged and the OUT signal is remains low. One skilled in the art will appreciate, however, that driving DATA high at any point during the half cycle of CLK following time T5 would cause signal HI to discharge and would cause signal OUT to be driven low.

Dynamic circuits, exemplified by the dynamic circuit 100 of FIG. 1A, are faster than other circuit configurations that are designed to accomplish the same logic evaluation function, including static implementations, because the output of dynamic circuits is already preset (e.g., pre-charged) to one logic state. Note that while CLK is low, the HI signal is pre-charged high so that the OUT signal is pre-charged low. Data setup time is virtually eliminated because clocking mechanisms (e.g., P1, N2) are integrated with evaluation logic (e.g., N1). One of ordinary skill in the art will appreciate that more complex evaluation logic (e.g. a multiple input mux) can be substituted for the simple evaluation logic device N1 shown in the dynamic circuit 100 without adversely impacting its speed or its associated power constraints.

Although dynamic circuits are fast, they heretofore have not provided for a latching mechanism on the input DATA signal. As illustrated at time T3, the OUT signal can change from low to high in response to the DATA signal changing from low to high after initially being evaluated low during the half cycle while the CLK signal is still high. This is at least one reason why pipeline logic designers have been required to provide registered inputs for existing dynamic circuits.

Figure 2A:
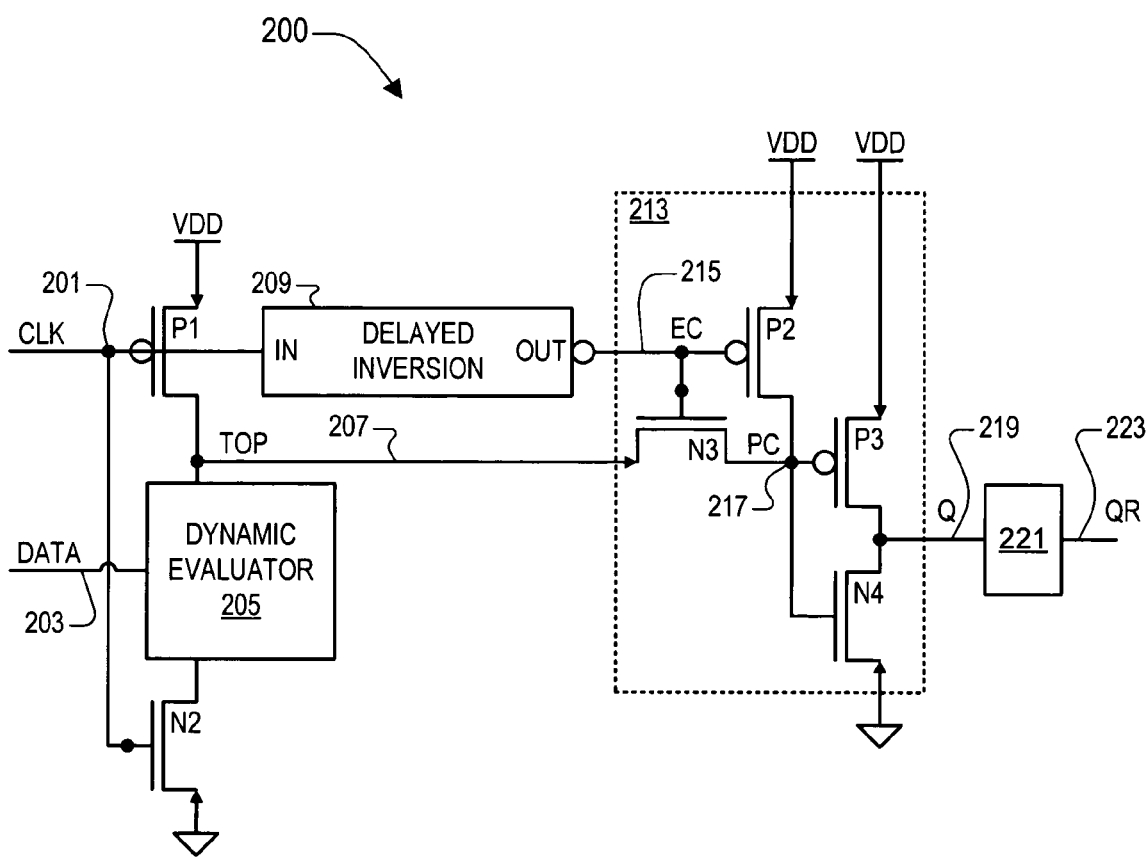
FIG. 2A is a schematic diagram of a dynamic logic RTZ latching mechanism implemented according to an exemplary embodiment of the present invention.

FIG. 2A is a schematic diagram of a dynamic logic RTZ latching mechanism 200 implemented according to an exemplary embodiment of the present invention. The input portion of the dynamic logic RTZ latching mechanism 200 includes a P-channel device P1 and an N-channel device N2 configured as a complementary pair of evaluation devices in a similar manner as that of the dynamic circuit 100. The source of P1 is coupled to VDD and its drain is coupled to a pre-charge node 207 providing a signal TOP. The N-channel device N1 of the dynamic circuit 100, however, is replaced by a dynamic evaluator circuit 205. The dynamic evaluator circuit 205 is coupled between the node 207 and the drain of N2, which has its source coupled to ground. The dynamic evaluator circuit 205 can be as simple as the device N1 or can be as complex as desired. In alternative and more complex embodiments, the dynamic evaluator circuit 205 is a more complex configuration of evaluation logic that "evaluates" by pulling the TOP signal low when the CLK signal is high. Also, although a single data signal (DATA) is shown being evaluated, those of ordinary skill in the art will appreciate that any number of data signals may be used during the evaluation process. The dynamic evaluator circuit 205 performs or otherwise evaluates a logic function, which may range from very simple to very complex.

The input clock signal CLK is provided via a node 201 to the gates of P1 and N2, and to an input of delayed inversion logic 209. The input DATA signal is provided via a node 203 to an input of the dynamic evaluator circuit 205. Latching logic 213 includes P-channel devices P2 and P3, and N-channel devices N3 and N4. The output of the delayed inversion logic 209 is coupled to a node 215 providing an evaluation complete signal EC, where the node 215 is coupled to the gates of P2 and N3. The EC signal may also be thought of or otherwise referred to as an inverted delayed clock signal. The sources of P2 and P3 are coupled to VDD. The node 207 is coupled to the source of the N-channel pass device N3, which has its drain coupled to a pull-up control node 217 providing a pull-up control signal PC. The node 217 is coupled to the drain of P2 and to the gates of P3 and N4. The drain of P3 is coupled to the drain of N4 at an output (or preliminary output) node 219 providing an output signal Q. The source of N4 is coupled to ground. RTZ circuits are often followed by footless domino logic, shown as 221, which is employed to convert the RTZ Q output to a registered output signal, shown as QR asserted on a node 223. Exemplary footless domino logic 221 and operation thereof is described below.

Figure 2B:
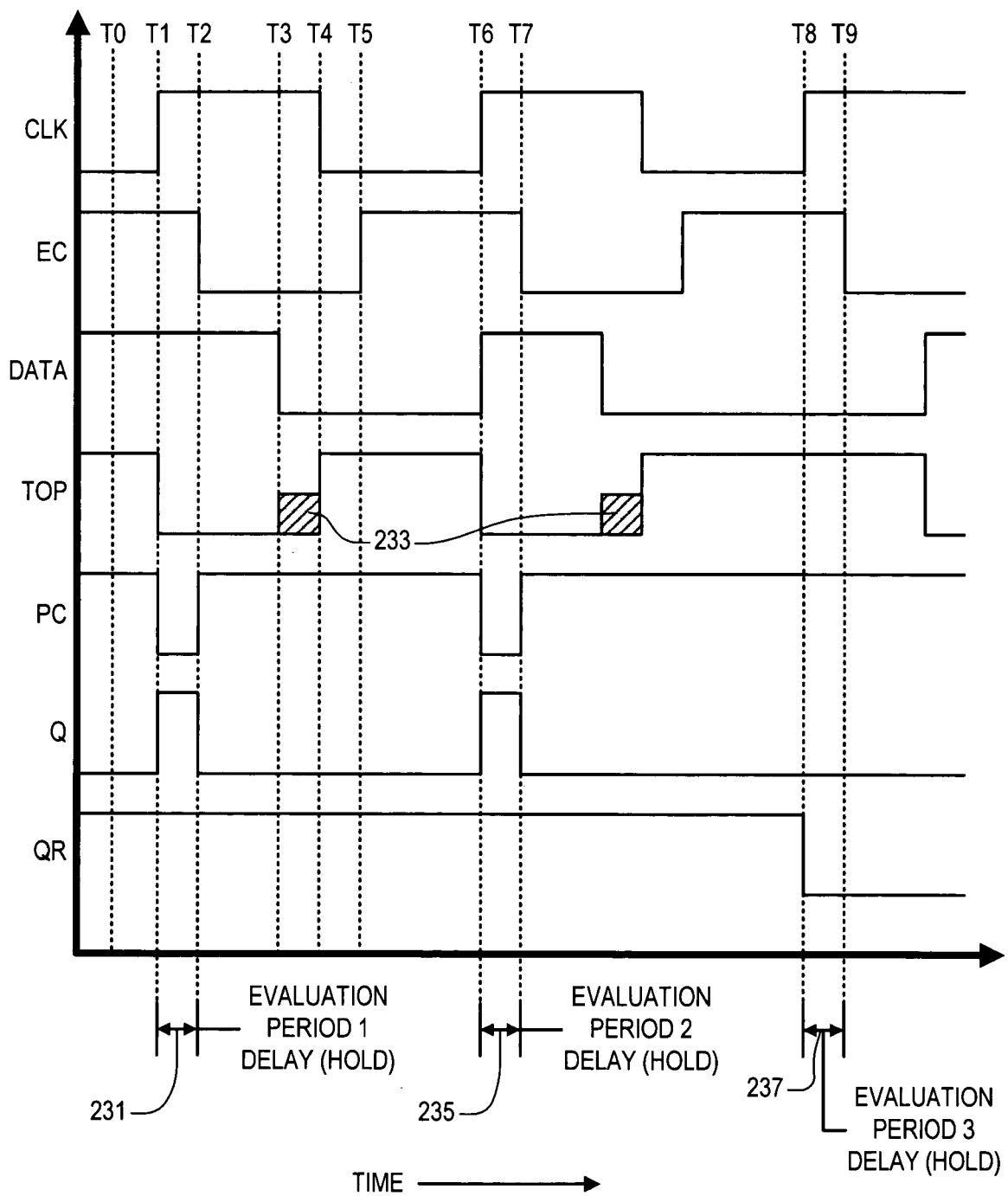
FIG. 2B is a timing diagram illustrating operation of the dynamic logic RTZ latching mechanism of FIG. 2A.

FIG. 2B is a timing diagram illustrating operation of the dynamic logic register 200, in which the CLK, EC, DATA, TOP, PC, Q and QB signals are plotted versus time. At a time T0, the TOP signal is pre-charged to a high logic level when the CLK signal is low in a similar manner as the HI signal of the dynamic circuit 100. The EC signal is a delayed and inverted version of the CLK signal. Prior to the CLK signal going low, however, the EC signal is low. Thus, P2 is on, and N3 is off, and signal PC is high. The EC signal is driven high after the CLK signal is driven low, turning off P2 and turning on N3, thus sustaining the high level on the PC signal via propagating the TOP signal through N3. P3 is off and N4 is on, thus keeping signal Q at its low return-to-zero low state, and the QR signal is high. The DATA signal is shown as being initially high.

An evaluation period begins upon each rising edge of the CLK signal and ends on the next falling edge of EC signal. The duration of the evaluation period is defined by the amount of delay through the delayed inversion logic 209. The CLK signal rises at subsequent time T1, turning off P1 and turning on N2 initiating a first evaluation period shown at 231. The state of the TOP signal during the evaluation period depends upon evaluation of the DATA signal by the dynamic evaluator circuit 205. In the illustrated embodiment of the dynamic evaluator circuit 205, the DATA signal being high at time T1 causes the dynamic evaluator circuit 205 to evaluate pulling TOP low. Since the EC signal is still high during the evaluation period 231, the state of TOP is propagated through N3 to the PC signal, which also goes low turning on P3 and turning off N4. The Q signal is pulled high by VDD via P3 and the QR signal is consequently pulled high (or otherwise stays high).

At time T2 upon expiration of the delay period through the delayed inversion logic 209, the EC signal goes low turning off N3 and turning on P2. At time T2, when signal EC goes low, the evaluation period is over. At any point following time T2, the state of the DATA signal can change without affecting the outputs Q or QR of the circuit 200. Hence, at time T2, the PC signal is pulled high again by VDD via P2, so that P3 is turned off. For illustration purposes, FIG. 2a depicts the DATA signal going low at time T3. Since N2 is still on, the state of the TOP signal is temporarily indeterminate or otherwise unknown as shown by the shaded region 233. The actual state or states of the TOP signal during this time is determined by the composition of the dynamic evaluator circuit 205. At subsequent time T4, the next falling edge of the CLK signal occurs, which turns N2 off and P1 back on so that the TOP signal is once again pre-charged by VDD via P1. Regardless of the transitions of the DATA and TOP signals from time T3 to time T4, since the EC signal remains asserted low, N3 is off and P2 is on, and the PC signal is pulled high keeping P3 off and N4 on, so that the states of the Q QR signals are held stable and unchanged.

The EC signal goes high at time T5 via the delayed inversion logic 209, which turns N3 on so that the high state of TOP is once again propagated to the PC signal via the pass device N3, which keeps the PC signal high. This in turn keeps P3 off and N4 on keeping Q low throughout the remainder of the half-cycle of the CLK signal. The QR signal also remains high throughout the remainder of the half-cycle of the CLK signal.

Operation is substantially identical beginning on the next rising edge of the CLK signal at time T6. In this case, however, the DATA signal, which was high at the previous rising edge of the CLK signal, is low and then asserted high at approximately the same time as the CLK signal at time T6. Since the DATA signal is high during the second evaluation period shown at 235 from time T6 to subsequent time T7 when the EC signal goes low, the DATA signal is properly evaluated by the operation of the dynamic evaluator circuit 205 with sufficient time, so that the Q and QR signals are asserted to their proper states as previously described. In this manner, it is appreciated by those of ordinary skill in the art that the setup time is effectively zero since the logic function is successfully evaluated even though the DATA signal transitions at approximately the same time as the CLK signal initiating the evaluation period.

Operation is similar during the third evaluation period shown at 237 between the next rising edge of the CLK signal at time T8 until the subsequent falling edge of the EC signal at time T9. In this case, however, the DATA signal is asserted at a logic low level, so that the dynamic evaluator circuit 205 fails to evaluate and the TOP signal remains high. Since the EC signal is still high, N3 is on and the high state of TOP is propagated to the PC signal keeping P3 off and N4 on. The Q signal remains low, and the QR signal is discharged to a low logic level at approximately time T8 due to operation of the footless domino logic 221. When the EC signal goes low at time T9, the PC signal is pulled high (or otherwise remains high) by VDD via P2, so that P3 remains off and N4 remains on keeping the Q signal pulled low. The only time when the Q signal is allowed to change state is during the relatively short evaluation periods (e.g., 231, 235, 237, etc.) when CLK and EC are both high.

The dynamic logic RTZ latching mechanism 200 provides an RTZ latching mechanism for evaluating inputs which can be flexibly tailored to provide more complex evaluants as a result of combination with other like circuits, whether in series or parallel. The dynamic logic RTZ latching mechanism 200 provides the speed and evaluation configurability of a dynamic circuit to more complex logic functions. The dynamic logic RTZ mechanism 200 exhibits a zero input setup time, a very short input hold time, and a nominal clock-to-output time, thus making it much faster than conventional logic configurations. The delayed inversion of the CLK signal combined with the latching mechanism 213 provides only a very short interval in which the output of the dynamic evaluator (via the TOP signal) is allowed to propagate to the output signal Q. Following the evaluation interval, Q returns to a low level for the remainder of the clock cycle.

Figure 2C:
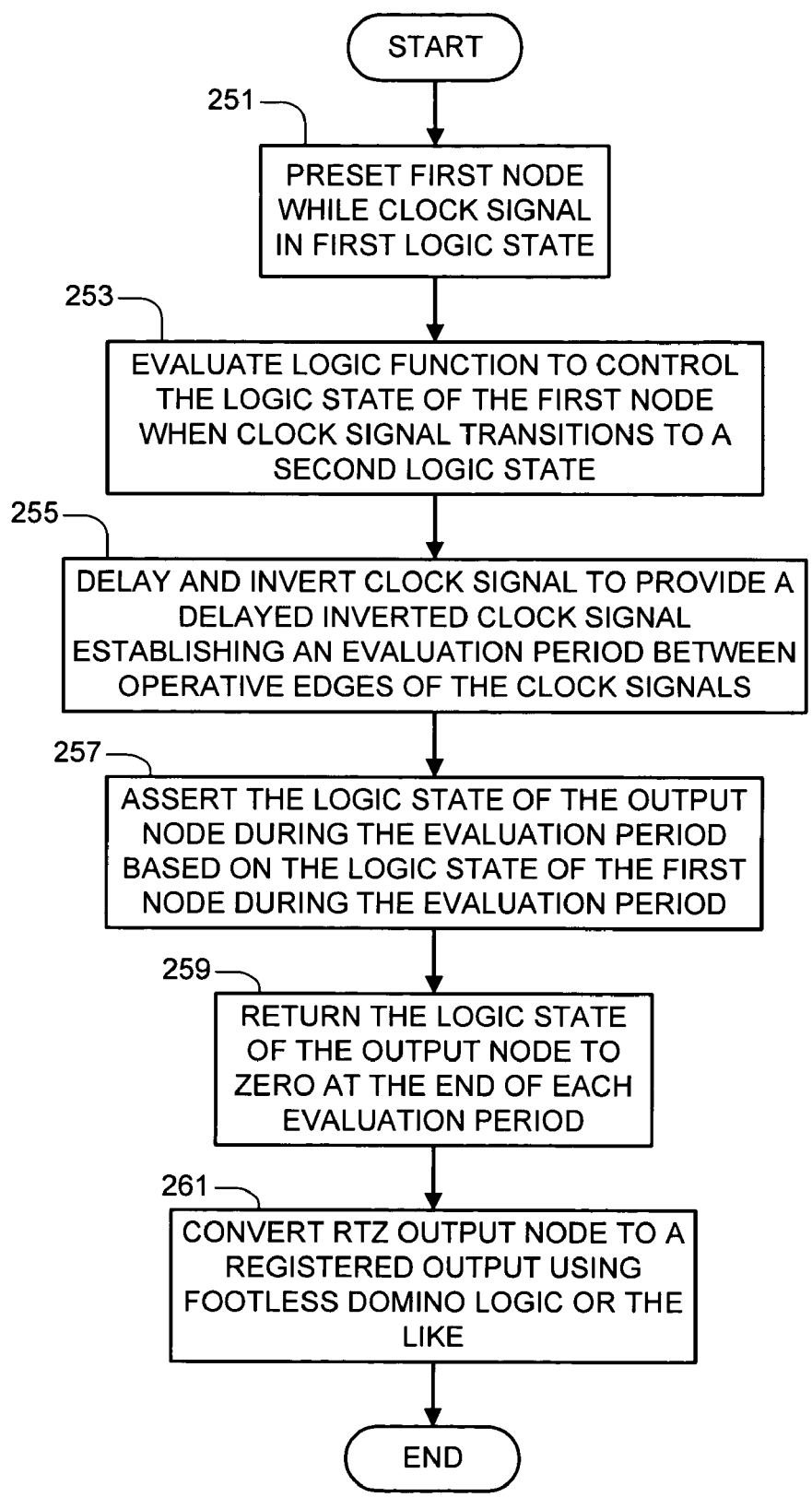
FIG. 2C is a flowchart diagram illustrating a dynamic logic RTZ latching method according to an exemplary embodiment of the present invention, such as, for example, illustrating operation of the dynamic logic RTZ latching mechanism of FIG. 2A.

FIG. 2C is a flowchart diagram illustrating a dynamic logic RTZ latching method according to an exemplary embodiment of the present invention, such as, for example, illustrating operation of the dynamic logic RTZ latching mechanism 200. Operation begins at a first block 251 in which a first node is preset while a clock signal is in a first logic state. In the exemplary embodiments previously described, for example, node 207 providing the TOP signal is pre-charged to a high logic state while the CLK signal is low. Operation proceeds to next block 253, in which a logic function is evaluated to control the logic state of the first node when the clock signal transitions to a second logic state. Continuing the previous example, the dynamic evaluator 205 evaluates a logic function based on one or more input DATA signals when the clock signal is asserted high. The logic function is said to evaluate when the TOP signal is discharged low, or is otherwise said to fail to evaluate if the TOP signal remains asserted high.

At next block 255, the clock signal is delayed and inverted to provide a delayed inverted clock signal. For example, the delayed inversion logic 209 delays the CLK signal to provide the evaluation complete signal EC. The duration of the clock delay can be configured to provide the minimum delay necessary to ensure completion of evaluation of the logic function being evaluated. In a synchronous pipelined architecture, such as a pipelined microprocessor or the like, the delays of the stages might be varied depending upon the corresponding logic function of each stage. Alternatively, a common delay may be determined based on the minimum time necessary to evaluate the longest-duration logic evaluation required in the series of stages. The duration of the delay establishes an evaluation period beginning with the operative transition of the clock signal (e.g., the rising edge of CLK), and the corresponding next transition of the inverted delayed clock signal (e.g., the next falling edge of EC).

At next block 257, the logic state of the output node is asserted during the evaluation period based on the logic state of the first node as determined during the evaluation period. With reference to the dynamic logic RTZ latching mechanism 200, for example, the Q signal is asserted low if TOP remains high and is asserted high if TOP is pulled low during the evaluation period. At next block 259, the logic state of the output node (e.g., the Q signal) is returned back to zero in accordance with RTZ operation upon the expiration of each evaluation period until the beginning of the next evaluation period. If a registered output is desired, operation proceeds to next block 261 in which the RTZ output node is converted to a registered output using footless domino logic or the like. As previously described, for example, the footless domino logic 221 may be employed for this purpose. In this manner, once the output logic state is determined during each evaluation period, the state of the registered output is maintained until the next evaluation period to ensure the integrity of the output signal regardless of fluctuations of input data signals.

Figure 3:
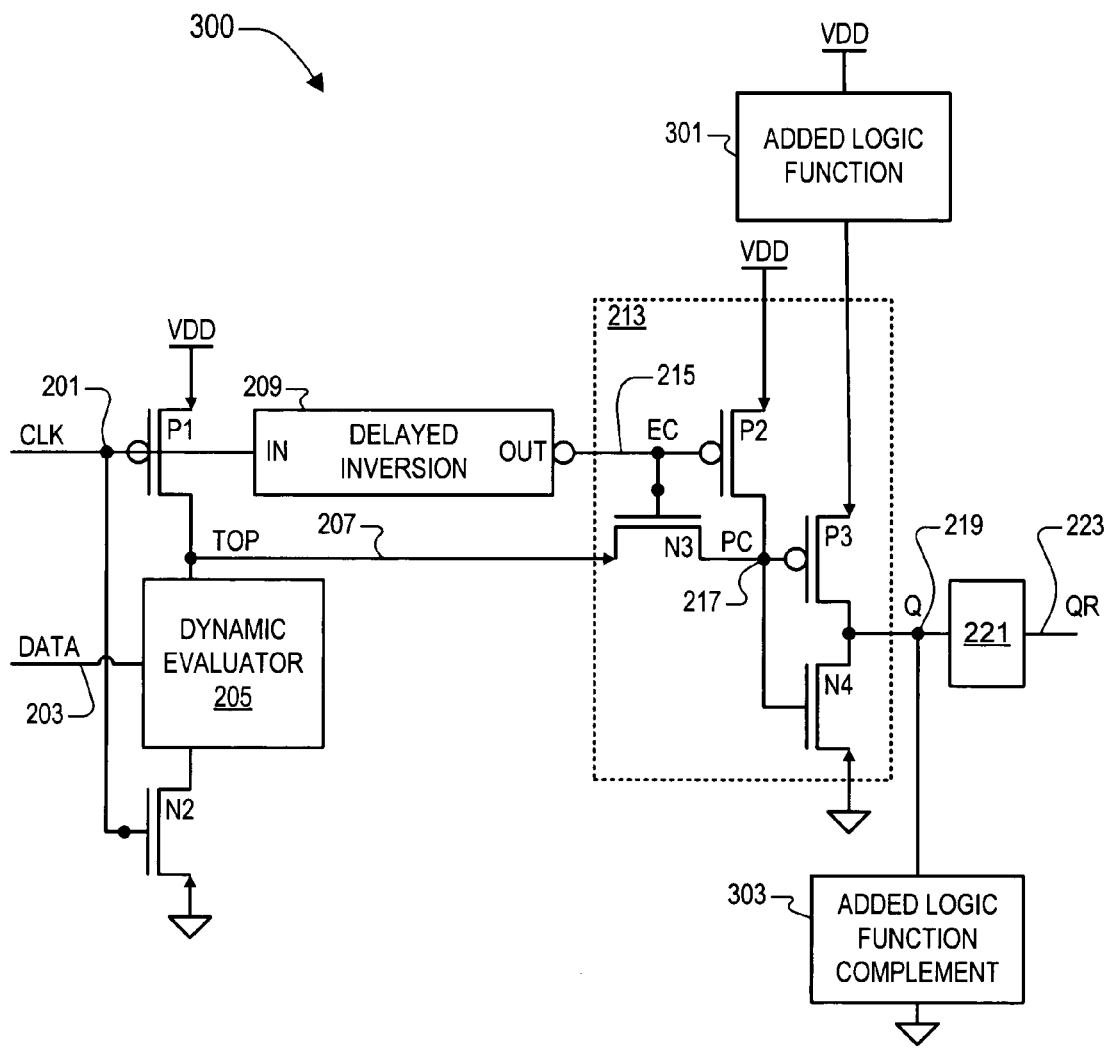
FIG. 3 is a schematic diagram of a dynamic logic RTZ latching mechanism implemented according to another exemplary embodiment of the present invention.

FIG. 3 is a schematic diagram of a dynamic logic RTZ latching mechanism 300 implemented according to another exemplary embodiment of the present invention. The dynamic logic RTZ latching mechanism 300 is similar to the dynamic logic RTZ latching mechanism 200 in which similar components assume identical reference numbers. The dynamic logic RTZ latching mechanism 300 includes an added logic function 301 coupled between VDD and the source of P3, and a complement of the added logic function 303 coupled between node 219 and ground. The added logic function 303 and its complement 305 enable functions that can override or otherwise prevent logic high outputs on the Q signal. The setup time for inputs provided to the added/ added complement logic functions 301, 303 is less than that for the DATA signal due to the time required for the evaluant to propagate through the dynamic evaluator 205, through N3 and through P3 to the output Q.

Figure 4:
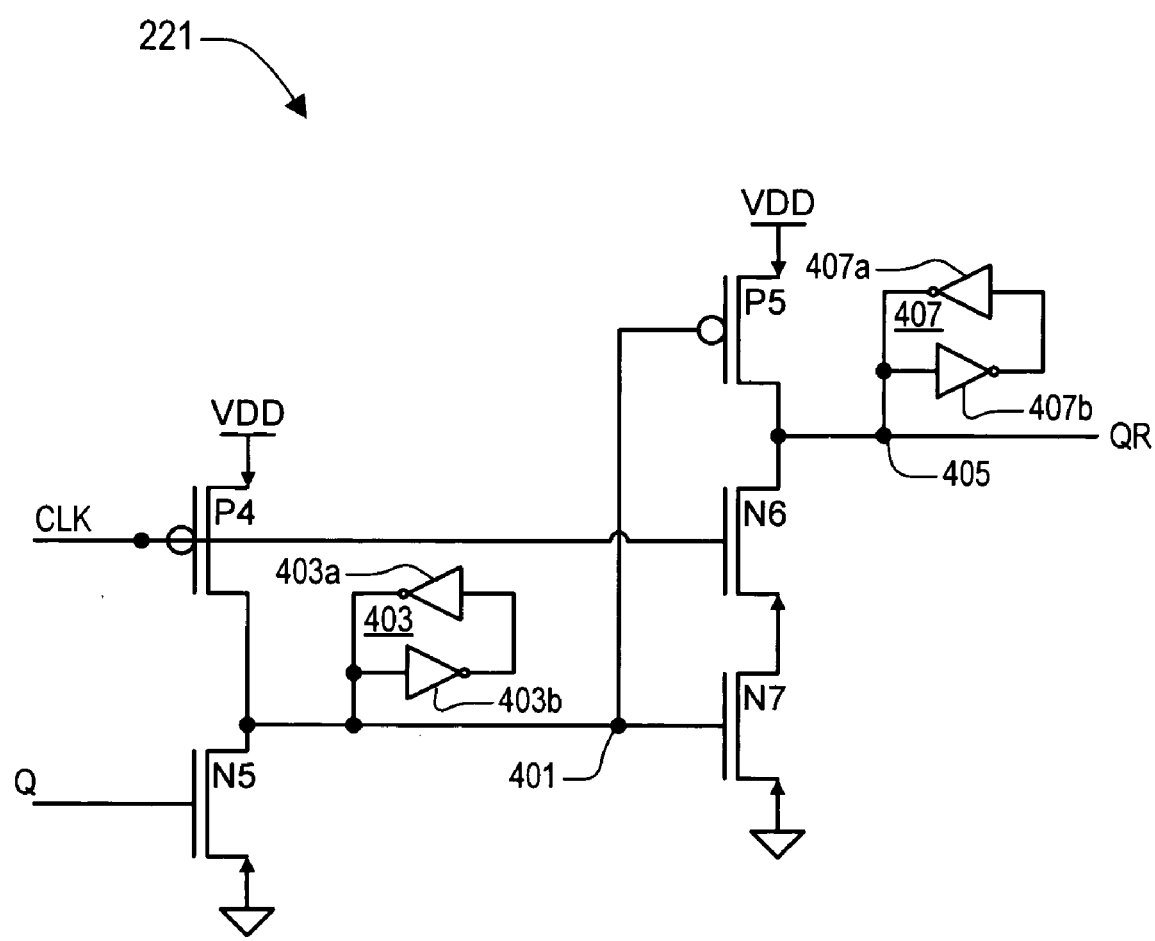
FIG. 4 is a more detailed schematic diagram of the footless domino logic according to an exemplary embodiment of the present invention that may be employed to convert an RTZ output signal to a registered output.

FIG. 4 is a more detailed schematic diagram of the footless domino logic 221 according to an exemplary embodiment of the present invention that may be employed to convert the RTZ output signal Q to the registered output QR. The CLK signal is provided to the gates of a P-channel device P4 and an N-channel device N6. The RTZ Q signal is provided to the gate of an N-channel device N5. The source of P4 is coupled to VDD and its drain is coupled to the drain of N5 at a node 401. The source of N5 is coupled to ground. A keeper circuit 403 is coupled to node 401, where the keeper circuit 403 includes a first inverter 403a having its output coupled to node 401 and its input coupled to the output of a second inverter 403b, having its input coupled to node 401. Node 401 is coupled to the gates of a P-channel device P5 and an N-channel device N7. P5, N6 and N7 are coupled in a stacked configuration between VDD and ground. In particular, the source of P5 is coupled to VDD and its drain is coupled to the drain of N6 at an output node 405 for providing the registered output signal QR. The source of N6 is coupled to the drain of N7, having its source coupled to ground. Another keeper circuit 407 is coupled to node 405, where the keeper circuit 407 includes a first inverter 407a having its output coupled to node 405 and its input coupled to the output of a second inverter 407b, having its input coupled to node 405.

The keeper circuits 403 and 407 may be implemented as weak keeper circuits that hold the state of the respective coupled node when not otherwise driven by a stronger device. For example, P4 over-rides the keeper circuit 403 and pulls node 401 high when CLK is low, N5 over-rides the keeper circuit 403 and pulls node 401 low when Q is high, and otherwise the keeper circuit 403 maintains the state of node 401 when not otherwise driven by P4 or N5. In a similar manner, P5 over-rides the keeper circuit 407 and pulls node 405 high when node 401 is low, N6 and N7 over-ride the keeper circuit 407 and pulls node 405 low when CLK and node 401 are both high, and otherwise the keeper circuit 407 maintains the state of node 405 when not otherwise driven by P5 or by N5 and N7.

When CLK is low, P4 is on which pulls node 401 high, which turns N7 on and P5 off. N6 is also off, allowing the QR signal to be kept at its previous level via the keeper circuit 407. When CLK goes high, N6 turns on and if the Q signal remains low, the keeper circuit 403 keeps N7 on and P5 off so that the QR signal remains unchanged. If instead the Q signal pulses high when CLK goes high, then N5 discharges node 401 during the pulse, turning off N7 and turning on P5. P5 turning on pulls the QR signal high during the pulse. When the Q signal returns to zero, N5 turns off, and the keeper circuit 403 keeps node 401 low keeping P5 on and N7 off during the remainder of the high half-cycle of the CLK signal. When CLK next goes low, P5 and N6 are both turned off so that the keeper circuit 407 retains the state of QR during the remainder of the low half-cycle of the CLK signal.

FIG. 4 depicts very simple evaluation logic N5 for a single input Q, yet one of the powerful features of the present invention is its ability to implement more complex logic evaluation functions than that depicted in the figure while still providing the function of converting to a registered output QR. Accordingly, FIG. 4 has been presented as a simple example for clarity purposes. To provide more complex evaluation functionality, it is noted that N-channel device N5 can be replaced by a plurality of N-channel devices with corresponding RTZ inputs that are configured to implement a desired complex logic function. For example, configuring the N-channel devices in parallel implements a logical OR function. Configuring the N-channel devices in series implements a logical AND function, etc.

In addition to providing for more complex logic functions by substituting for device N5, additional complexity of evaluation is achieved by substituting for devices P5 and N7. To implement these more complex logic functions, it is necessary to configure the P logic substituted for P5 as the logical dual function of that N logic that is substituted for N5.

Figure 5:
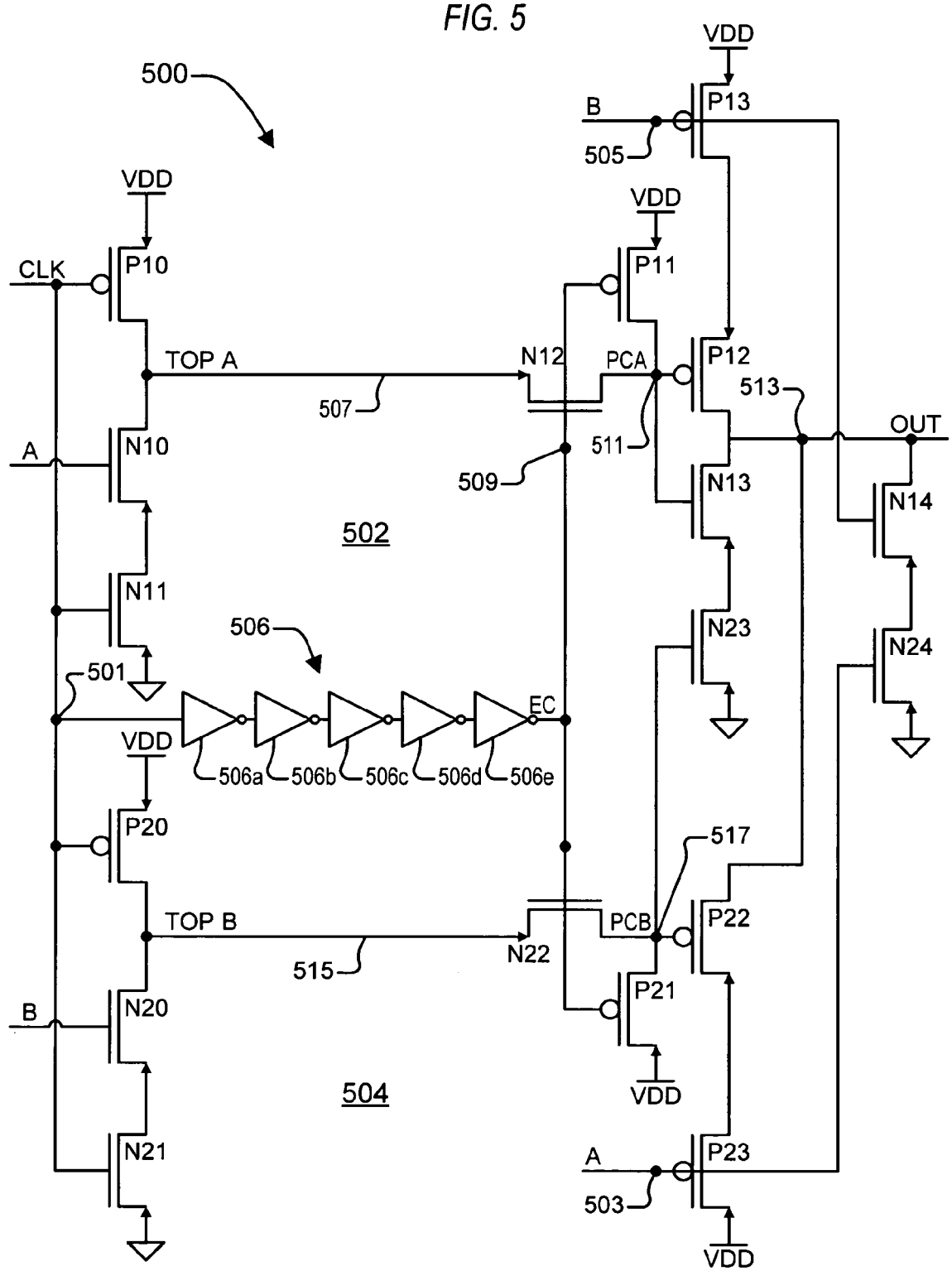
FIG. 5 is a schematic diagram of a dynamic logic RTZ 2-input XOR circuit implemented using dynamic logic RTZ latching mechanisms according to an exemplary embodiment of the present invention.

FIG. 5 is a schematic diagram of a dynamic logic RTZ 2-input exclusive-OR (XOR) circuit 500 implemented using dynamic logic RTZ latching mechanisms according to an exemplary embodiment of the present invention. The XOR circuit 500 includes two dynamic logic evaluators 502 and 504 coupled in parallel and sharing common delayed inversion logic 506. The dynamic logic evaluator 502 includes P-channel devices P10–P13 and N-channel devices N10–N14, and the dynamic logic evaluator 504 includes P-channel devices P20–P23 and N-channel devices N20–N24. The CLK signal is asserted on node 501, which is coupled to the gates of P10, N11, P20 and N21 and to the input of the delayed inversion logic 506. The delayed inversion logic 506 includes five inverters 506a–506e coupled in series between node 501 and a node 509 providing a signal EC. Two input signals A and B are asserted on nodes 503 and 505, respectively. Node 503 providing signal A is coupled to the gates of N10, P23 and N24 and node 505 providing signal B is coupled to the gates of N20, P13 and N14.

The source of P10 of the dynamic logic evaluator 502 is coupled to VDD and its drain is coupled to the drain of N10 at a node 507 providing a signal TOP A. The source of N10 is coupled to the drain of N11, having its source coupled to ground. Node 507 is coupled to the source of N-channel pass device N12, having its gate coupled to node 509 for receiving the EC signal and its drain coupled to a node 511 providing a first pull-up control signal PCA. The source of P11 is coupled to VDD and its drain is coupled to node 511, which is further coupled to the gates of P12 and N13. The source of P13 is coupled to VDD and its drain is coupled to the source of P12. The drain of P12 is coupled to an output node 513 providing an output signal OUT, where node 513 is further coupled to the drain of N13. The source of N13 is coupled to the drain of N23, which has its source coupled to ground. The drain of N14 is coupled to the output node 513, and its source is coupled to the drain of N24, having its source coupled to ground.

The source of P20 of the dynamic logic evaluator 504 is coupled to VDD and its drain is coupled to the drain of N20 at a node 515 providing a signal TOP B. The source of N20 is coupled to the drain of N21, having its source coupled to ground. Node 515 is coupled to the source of N-channel pass device N22, having its gate coupled to node 509 for receiving the EC signal and its drain coupled to a node 517 providing a second pull-up control signal PCB. The source of P21 is coupled to VDD and its drain is coupled to node 517, which is further coupled to the gates of P22 and N23. The source of P23 is coupled to VDD and its drain is coupled to the source of P22. The drain of P22 is coupled to the output node 513.

The dynamic logic evaluator 502 evaluates the A input signal to generate the TOP A signal and the dynamic logic evaluator 504 evaluates the B input signal to generate the TOP B signal in a similar manner as previously described for the dynamic logic RTZ latching mechanism 200. The dynamic evaluator circuit for each of the dynamic logic evaluators 502 and 504 is a single N-channel device N10 and N20, respectively. In either case, the evaluator evaluates when the corresponding input signal is high upon the rising edge of the CLK signal. The delay inversion circuit 506 is implemented with a selected number of series of inverters to provide a selected evaluation period. In a specific embodiment using a 0.15 micron fabrication process, for example, an approximate evaluation period of 100 picoseconds (ps) is achieved. It is appreciated by those of ordinary skill in the art that the evaluation period may be adjusted to account for the particular process employed and the function being implemented. It is understood that the added logic and its complement may be added to the with no significant affect whatsoever on the setup or data-to-output times. The two RTZ latching mechanisms 502, 504 are wire-ORed coupled together at the output node 513 at the drains of P12 and P22 and complementary pull-down control for both evaluants is provided via devices N13 and N23. It is noted that the dynamic logic RTZ XOR circuit 500 has zero setup time and a clock-to-output time that is much better than a conventional XOR gate because inverter stages are not required for either of the two inputs.

Figure 6:
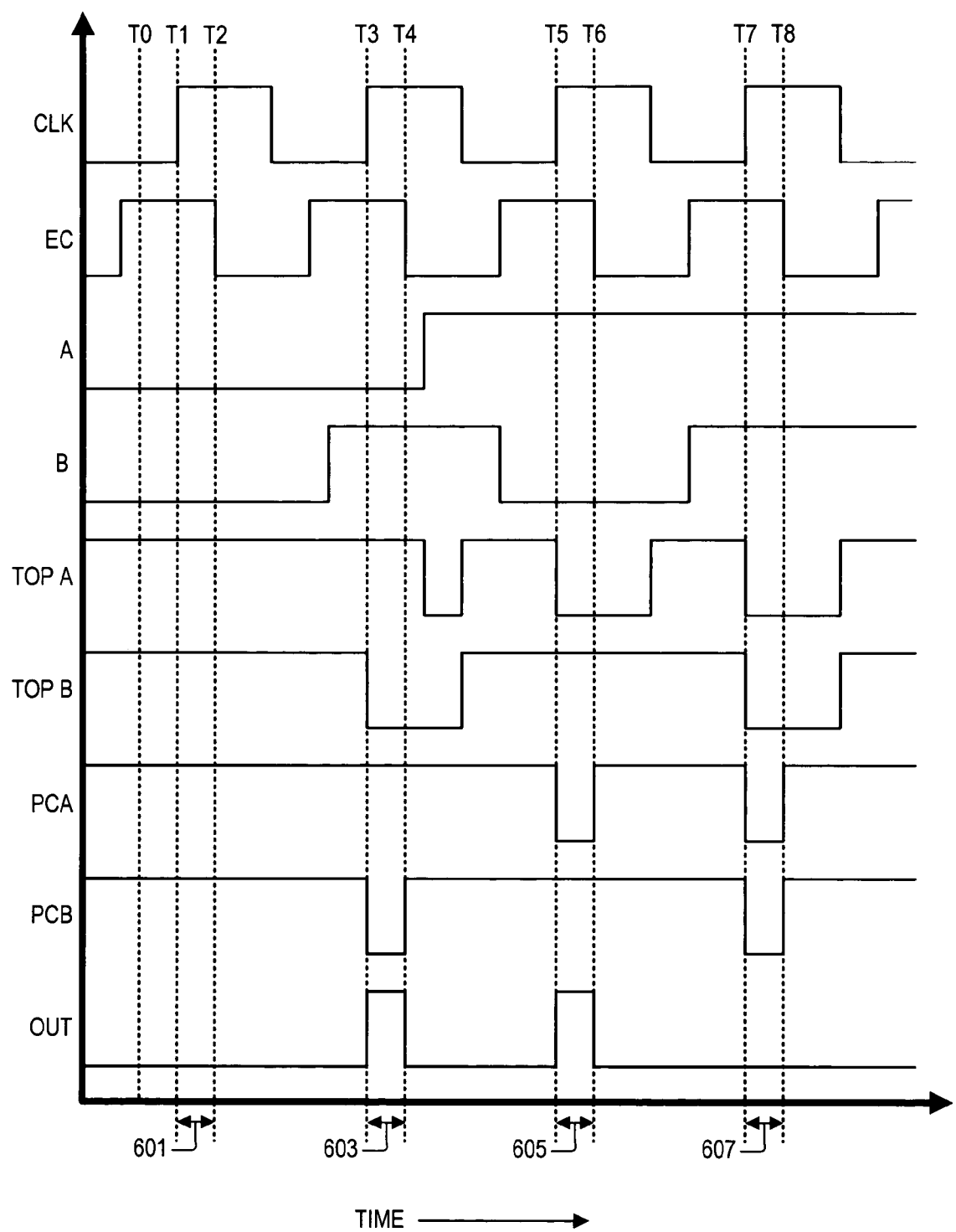
FIG. 6 is a timing diagram illustrating operation of the dynamic logic RTZ XOR circuit of FIG. 5.

FIG. 6 is a timing diagram illustrating operation of the dynamic logic RTZ XOR circuit 500, in which the CLK, EC, A, B, TOP A, TOP B, PCA, PCB, and OUT signals are plotted versus time. At a time T0 when the CLK signal is low and the EC signal is high, the TOP A and TOP B signals are both pre-charged to a high logic level, the PCA and PCB signals are pulled high by the TOP A and TOP B signals via the pass devices N12 and N22, respectively, and the OUT signal is pulled low by the N-channel devices N13 and N23. The A and B signals are both initially low.

At time T1, the CLK signal goes high initiating a first evaluation period 601 from time T1 to time T2 when the EC signal goes low after the delay through the delayed inversion logic 506. The A and B signals remain low during the first evaluation period 601, so that the TOP A and TOP B signals remain asserted high. Since the EC signal is also high, the TOP A and TOP B signals are passed to the PCA and PCB signals, which remain asserted high. Thus, the OUT signal remains low. When the EC signal is asserted low at time T2, both the PCA and PCB signals are pulled high by VDD via P11 and P21, respectively, so that the OUT signal remains low while the EC signal is low. For each cycle after EC goes low ending the corresponding evaluation period, the PCA and PCB signals are pulled high and OUT is pulled low according to RTZ operation. Also during each cycle after the evaluation period, when the CLK signal is next asserted low, the TOP A and TOP B signals are pre-charged high, so that when the EC signal next goes high, the PCA and PCB signals are pulled high keeping the OUT signal low for the remainder of the CLK cycle.

At time T3, the CLK signal goes high again initiating a second evaluation period 603 from time T3 to time T4 when the EC signal next goes low. The A signal remains low but the B signal is asserted high during the second evaluation period 603. The TOP A signal stays high but the TOP B signal is pulled low by the N-channel devices N20 and N21. Since the EC signal is also high, the TOP A and TOP B signals are passed to the PCA and PCB signals, so that the PCA signal remains high while the PCB signal is pulled low. Since the PCB and A signals are both low, the OUT signal is pulled high by VDD via pull-up devices P22 and P23 during the second evaluation period 603. When EC next goes low at time T4, the OUT signal is once again pulled low for the remainder of the CLK cycle.

At time T5, the CLK signal goes high again initiating a third evaluation period 605 from time T5 to time T6 when the EC signal next goes low. In this case, the A signal is asserted high while the B signal is low during the third evaluation period 605. The TOP A signal is pulled low by pull-down devices N10 and N11 and the TOP B signal remains high. Since the EC signal is also high, the TOP A and TOP B signals are passed to the PCA and PCB signals, so that the PCB signal remains high while the PCA signal is pulled low. Since the PCA and B signals are both low, the OUT signal is pulled high by VDD via pull-up devices P12 and P13 during the third evaluation period 605. When EC next goes low at time T6, the OUT signal is once again pulled low for the remainder of the CLK cycle.

At time T7, the CLK signal goes high again initiating a fourth evaluation period 607 from time T7 to time T8 when the EC signal next goes low. In this case, the A and B signals are both asserted high during the fourth evaluation period 607. The TOP A and TOP B signals are both pulled low by pull-down devices N10, N11 and N20, N21, respectively, so that the PCA and PCB signals are both asserted low as well. Even though pull-up devices P12 and P22 are turned on, since the A and B signals are both high, the pull-up devices P13 and P23 are both off. Also, the pull-down devices N14 and N24 are both on so that the OUT signal remains low during the fourth evaluation period 607. When EC next goes low at time T8, the OUT signal is once again pulled low for the remainder of the CLK cycle.

It is appreciated that the OUT signal operates according to XOR logic in response to the A and B input signals during the evaluation periods. As shown, when the A and B input signals are at the same logic level upon the rising edge of the CLK signal, the OUT signal remains low and when the A and B input signals are at different logic levels, the OUT signal is asserted high. In accordance with RTZ operation, the OUT signal is returned to zero at the end of the evaluation period. A significant advantage of the XOR circuit 500 is that both operands are input as true values, thereby avoiding having to invert either operand as required for typical XOR circuits. In this manner, the input inverter stage is eliminated allowing a faster XOR design. As previously described, the OUT signal may be converted to a registered output by coupling footless domino logic at the output node 513, such as the footless domino logic 221.

A dynamic logic RTZ latching mechanism according to an embodiment of the present invention provides a mechanism for generating RTZ outputs for simple to complex logic evaluation functions. A delayed and inverted version of the CLK signal (e.g., the EC signal) provides a relatively short evaluation interval. The mechanism has a zero setup time and a very short hold time, thus making it markedly faster than existing configurations. The output does not latch but instead pulses to the correct logic state during the evaluation period. The output returns to zero on its own during the time the clock is high and stays at zero when the clock goes low to pre-charge the TOP node. Thus, there is no need to have the clock attached to an N-channel device at the input to facilitate pre-charging. An output latching mechanism, such as a footless domino circuit or the like, may be added to convert the RTZ output to a registered output. In this manner, the present invention provides an RTZ latching mechanism and/or a registering mechanism with full register functionality for complex dynamic logic. When employed in a pipelined architecture, the present invention enables overall device operating speed to be significantly increased. Because the setup time is zero, the data-to-output time, which dictates the cycle time in pipeline configurations, is significantly reduced.

Although the present invention has been described in considerable detail with reference to certain preferred versions thereof, other versions and variations are possible and contemplated. For example, the dynamic evaluator circuit can be as simple or as complex as desired. The added logic function and its complement 301, 303 may be omitted or otherwise implemented in any suitable manner as understood by those of ordinary skill in the art. Moreover, although the present disclosure contemplates one implementation using metal-oxide semiconductor (MOS) type devices, including complementary MOS devices and the like, such as, for example, NMOS and PMOS transistors, it may also be applied in a similar manner to different or analogous types of technologies and topologies, such as bipolar devices or the like.

Finally, those skilled in the art should appreciate that they can readily use the disclosed conception and specific embodiments as a basis for designing or modifying other structures for providing out the same purposes of the present invention without departing from the spirit and scope of the invention as defined by the appended claims.

What is claimed is:

1. A dynamic logic return-to-zero (RTZ) latching mechanism, comprising:
    a complementary pair of evaluation devices responsive to a clock signal;
    a dynamic evaluator, coupled between said complementary pair of evaluation devices at a pre-charged node, that evaluates a logic function based on at least one input data signal;
    delayed inversion logic that receives said clock signal and that outputs an evaluation complete signal being a delayed and inverted version of said clock signal; and
    latching logic, responsive to said evaluation complete signal and the state of said pre-charged node, that asserts the logic state of an output node based on the state of said pre-charged node during an evaluation period between an operative edge of said clock signal and the next edge of said evaluation complete signal, and that returns said output node to zero between evaluation periods, wherein said latching logic comprises:
        an N-channel pass device having a gate receiving said evaluation complete signal and a drain and source coupled between said pre-charged node and a pull-up control node;
        a first P-channel pull-up device having a gate receiving said evaluation complete signal and a drain and source coupled between a source voltage and said pull-up control node;
        a second P-channel pull-up device having a gate coupled to said pull-up control node and a drain and source coupled between said source voltage and said output node; and
        an N-channel pull-down device having a gate coupled to said pull-up control node and a drain and source coupled between said output node and ground.

2. The dynamic logic RTZ latching mechanism of claim 1, wherein said complementary pair of evaluation devices comprises:
    a P-channel device having a gate receiving said clock signal and a drain and source coupled between a source voltage and said pre-charged node; and
    an N-channel device having a gate receiving said clock signal and a drain and source coupled between said dynamic evaluator and ground.

3. The dynamic logic RTZ latching mechanism of claim 1, wherein said dynamic evaluator comprises a complex logic circuit.

4. The dynamic logic RTZ latching mechanism of claim 1, wherein said delayed inversion logic comprises a series chain of inverters.

5. The dynamic logic RTZ latching mechanism of claim 1, further comprising added logic coupled between said source voltage and said second P-channel pull-up device and added complementary logic coupled between said output node and ground, said added logic and said added complementary logic collectively operative to prevent a selected state of said output node.

6. The dynamic logic RTZ latching mechanism of claim 1, further comprising a footless latching domino circuit having an input coupled to said output node and a registered output node providing a registered output signal.

7. The dynamic logic RTZ latching mechanism of claim 6, wherein said footless latching domino circuit comprises:
    a first P-channel device having a gate receiving said clock signal and a drain and source coupled between a source voltage and a control node;
    a first N-channel device having a gate coupled to said output node and a drain and source coupled between said control node and ground;
    a first keeper circuit coupled to said control node;
    a second P-channel device having a gate coupled to said control node and a drain and source coupled between said source voltage and said registered output node;
    a second keeper circuit coupled to said registered output node;
    a second N-channel device having a gate receiving said clock signal and a drain and source coupled between said registered output node and an intermediate node; and
    a third N-channel device having a gate coupled to said control node and a drain and source coupled between said intermediate node and ground.

8. A dynamic latch circuit, comprising:
    a dynamic circuit that pre-charges at least one pre-charged node while a clock signal is low and that evaluates a logic function for controlling the state of said at least one pre-charged node when said clock signal goes high;
    a delayed inverter receiving said clock signal and providing an inverted delayed clock signal; and
    a latching circuit, coupled to said dynamic circuit and said delayed inverter, that controls the state of an output node based on the state of said at least one pre-charged node during each evaluation period beginning when said clock signal goes high and ending when said inverted delayed clock signal next goes low, and that otherwise asserts said output node to a zero logic state, wherein said latching circuit comprises:
        a pass device that couples a second node to said at least one pre-charged node when said inverted delayed clock signal is high;
        a first pull-up device that pulls said second node high while said inverted delayed clock signal is low;
        a second pull-up device that pulls said output node high when said second node is low; and
        a pull-down device that pulls said output node low when said second node is high.

9. The dynamic latch circuit of claim 8, wherein said dynamic circuit comprises:
    a pull-up device, coupled to a first pre-charged node, that pre-charges said first pre-charged node while said clock signal is low;
    a logic circuit, coupled to said first pre-charged node, that evaluates said logic function; and
    a pull-down device, coupled to said logic circuit, that enables said logic circuit to evaluate said logic function when said clock signal goes high.

10. The dynamic latch circuit of claim 8, wherein said delayed inverter comprises a series chain of inverters.

11. The dynamic latch circuit of claim 8, further comprising a footless latching domino circuit coupled to said output node that provides a corresponding registered output.

12. The dynamic latch circuit of claim 8, further comprising:
   said dynamic circuit comprising a plurality of dynamic circuits, each receiving a corresponding one of a plurality of input signals and pre-charging a corresponding one of a plurality of pre-charged nodes; and
   said latching circuit comprising a plurality of latching circuits, each coupled to a corresponding one of said plurality of dynamic circuits, each receiving a corresponding one of said plurality of input signals, and each having an output that is wire-ORed coupled to said output node.

13. The dynamic latch circuit of claim 12, wherein each of said plurality of dynamic circuits comprises:
   a first P-channel device having a gate receiving said clock signal and a drain and source coupled between a source voltage and a corresponding one of said plurality of pre-charged nodes;
   a first N-channel device having a gate receiving a corresponding one of said plurality of input signals and a drain and source coupled between said corresponding pre-charged node and a corresponding one of a plurality of first intermediate nodes; and
   a second N-channel device having a gate receiving said clock signal and a drain and source coupled between said corresponding first intermediate node and ground.

14. The dynamic latch circuit of claim 13, wherein each of said plurality of latching circuits comprises:
   a third N-channel device having a gate receiving said inverted delayed clock signal and a drain and source coupled between a corresponding one of said plurality of pre-charged nodes and a corresponding one of a plurality of pull-up control nodes;
   a second P-channel device having a gate receiving said inverted delayed clock signal and a drain and source coupled between said source voltage and said corresponding pull-up control node;
   a third P-channel device having a gate receiving a corresponding one of said plurality of input signals and a drain and source coupled between said source voltage and a corresponding one of a plurality of second intermediate nodes;
   a fourth P-channel device having a gate coupled to said corresponding pre-charged node and a drain and source coupled between said corresponding second intermediate node and said output node;
   a fourth N-channel device having a gate coupled to said corresponding pre-charged node and a drain and source coupled in a first stack configuration between said output node and ground; and
   a fifth N-channel device having a gate receiving said corresponding input signal and a drain and source coupled in a second stack configuration between said output node and ground.

15. The dynamic latch circuit of claim 14, wherein said logic function comprises an exclusive-OR logic function.

16. A dynamic logic RTZ latching method, comprising:
   pre-setting a first node while a clock signal is in a first logic state;
   dynamically evaluating a logic function to control the logic state of the first node when the clock signal transitions to a second logic state;
   delaying and inverting the clock signal and providing a delayed inverted clock signal;
   latching a logic state of an output node based on the logic state of the first node determined during an evaluation period beginning when the clock signal transitions to the second logic state and ending with the next corresponding transition of the delayed inverted clock signal; and
   returning the logic state of the output node to a low logic state between evaluation periods, said returning comprising:
      keeping the pull-up control node at a high logic state while the delayed inverted clock signal is at a low logic state and also while the clock signal is at a low logic state.

17. The method of claim 16, wherein said pre-setting a first node comprises pre-charging the first node to a high logic state.

18. The method of claim 16, further comprising adding a latching domino circuit to the output node to provide a registered output signal.

19. The method of claim 16, the first logic state being a low logic state and the second logic state being a high logic state, wherein said latching a logic state of an output node comprises:
   passing a logic state of the first node to a pull-up control node while the delayed inverted clock signal is in a high logic state;
   pulling the output node to a high logic state if the pull-up control node is in a low logic state; and
   pulling the output node to a low logic state if the first node is in a high logic state.

* * * * *